United States Patent [19]

Eidschun

[11] 4,361,470
[45] * Nov. 30, 1982

[54] CONNECTOR CONTACT POINT

[75] Inventor: Charles D. Eidschun, Seminole, Fla.

[73] Assignee: Micro-Plate, Inc., Clearwater, Fla.

[*] Notice: The portion of the term of this patent subsequent to Oct. 10, 1995, has been disclaimed.

[21] Appl. No.: 171,906

[22] Filed: Jul. 24, 1980

Related U.S. Application Data

[63] Continuation of Ser. No. 764,070, Jan. 31, 1977, abandoned, Continuation-in-part of Ser. No. 502,536, Sep. 3, 1974, and Ser. No. 580,304, May 23, 1975, Pat. No. 4,036,705, and Ser. No. 666,618, Mar. 15, 1976, Pat. No. 4,064,019.

[51] Int. Cl.³ .................... C25D 5/02; C25D 5/06; C25D 5/12; C25D 5/16
[52] U.S. Cl. ................................ 204/15; 204/40
[58] Field of Search .................. 204/15, 40, 224 R

[56] References Cited

U.S. PATENT DOCUMENTS 3,364,064  1/1968  Wijburg ............................. 204/40
4,001,093  1/1977  Koontz .............................. 204/15

Primary Examiner—T. Tufariello
Attorney, Agent, or Firm—Jack E. Dominik

[57] ABSTRACT

A connector plated contact point having a curvilinear area terminating in a feather edge. Optionally the contact has a conductive underbody having a feather edge. Both feather edged metals have a raised central portion. The contact is formed on a contact plater having a pair of opposed belts for grasping and driving contact point through a pair of opposed jaws to be plated by contact on an anode roller, the same describing a helical trace on the roller.

15 Claims, 14 Drawing Figures

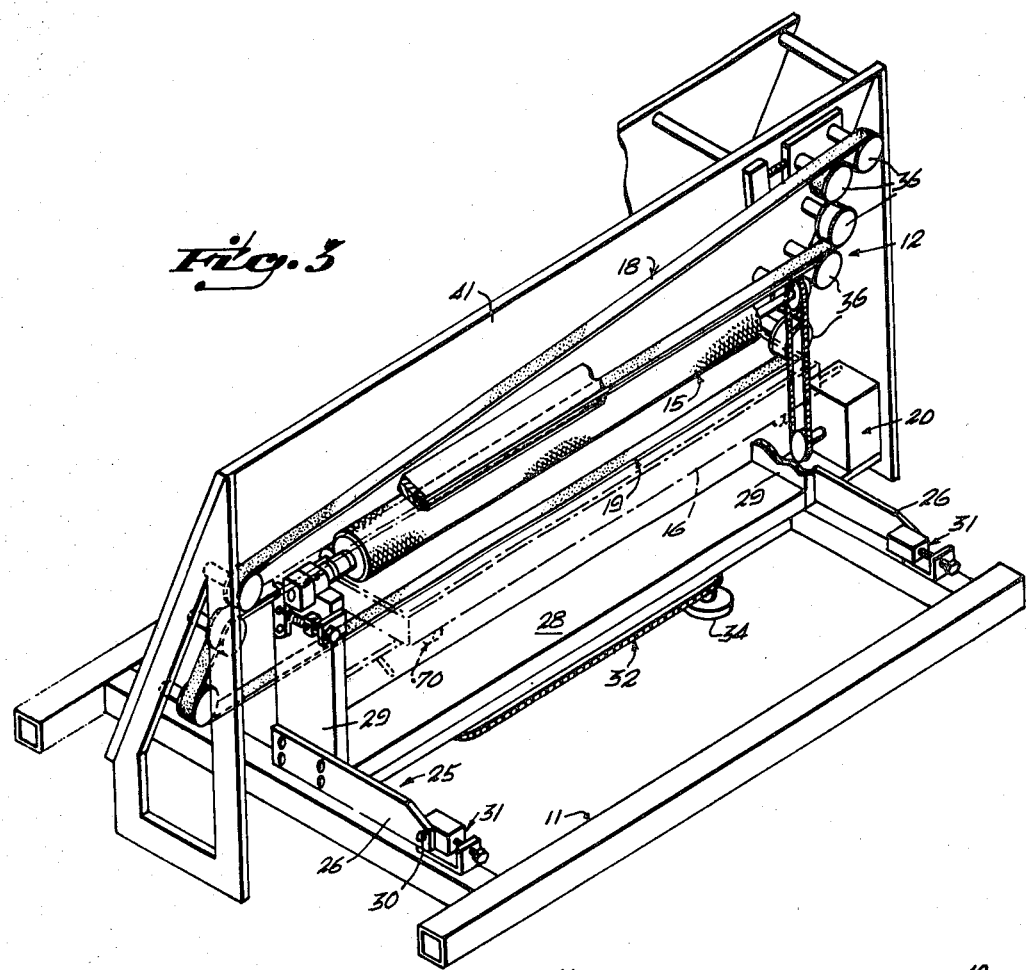
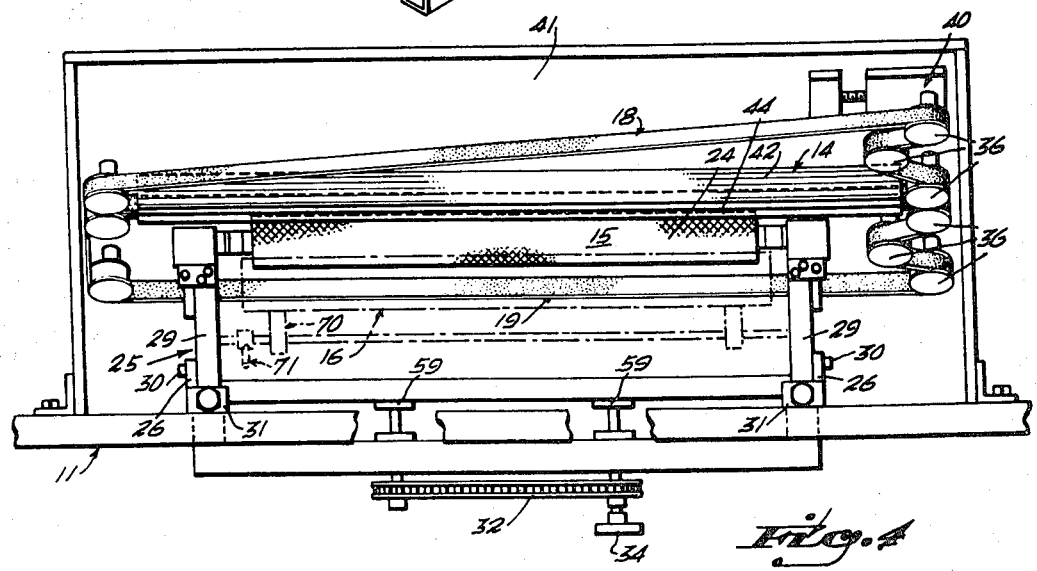

CONNECTOR CONTACT POINT

BACKGROUND OF THE INVENTION

RELATED APPLICATIONS

This application is a continuation of earlier filed application Ser. No. 764,070, filed Jan. 31, 1977, now abandoned which in turn is a continuation-in-part of earlier filed application Ser. No. 502,536, filed Sept. 3, 1974, Ser. No. 580,304, filed May 23, 1975 now U.S. Pat. No. 4,036,705, and Ser. No. 666,618, filed Mar. 15, 1976 now U.S. Pat. No. 4,064,019.

FIELD OF INVENTION

The field of invention relates to yieldable connector contact points usually used to connect removable printed circuit boards to host electronic apparatus.

DESCRIPTION OF THE PRIOR ART

The prior art equipment is exemplified in U.S. Pat. Nos. 936,472; 3,661,752; and 3,904,489; and also in French Pat. No. 331930 and Patents in Great Britain Nos. 760016 and 18643 (the latter published in 1899).

The connectors of the prior art are usually produced from wire, passed through fourslide, multislide, or progressive dies. The contacts invariably are yieldable, and present a curvilinear surface for sliding yieldable electrical contact normally with a printed circuit board gold plates finger or other electronic element. In order to maximize the electrical transmission at the contact point, a highly conductive noncorrosive metal is plated onto the connector. In most instances the material used is gold.

Heretofore the gold has been applied to the connectors either by dip plating, or in some instances by welding a spot of gold onto the connector at its contact point, and then spanking the gold to extend it out over the curvilinear area. When the total unit is plated, a significant amount of gold is plated to the rear face of the connector and accordingly serves no purpose other than to significantly increase the cost of the deposition of gold where it is not needed. Where the contact point on the connector has been the subject of welded gold attachment, and spanking, the feather edges of the gold that extend away from the weld point are at best in physical contact with the underlying connector, and often can be easily broken away. In addition, because the entire interface is not welded, or preferably the subject of electrodeposition, the electrical connection in addition to the physical connection is weakened below optimum or maximum.

In connection with making connectors of the prior art types, traditional arrays of connectors are dipped into a plating solution. Where precious metals such as gold are employed in the plating, this overplating even to the extent of 100%, doubles the cost of material which is a significant cost in the gold plating of any product. Also because the prior art involves dipping, there is no way of discretely determining the specific area to be plated, much less determining the exact thickness to be plated on the discreet area.

SUMMARY OF THE INVENTION

The present invention relates to a plated contact point on a connector in which two metals are plated to the connector, the first one being a corrosion resistant metal such as nickel, and the second being a metal having excellent electrical characteristics such as gold. The two are plated to a curvilinear portion of the connector, and in such a fashion that a feather edge is developed on the end portions of the underbody metal as well as the overlay metal plating, and a raised portion is essentially at the center of both metals which becomes the tangent point of connection. Both the underbody feather edge and the overlay feather edge terminate essentially at the same location on the curvilinear portion which is plated. The interface between the underbody metal and the connector as well as the interface between the overlay metal and the underbody metal are characterized by coterminous areas of electrodeposition and are essentially free of porosity. Contaminants attributable to dripping or dipping on the balance of the connector are minimized due to the metered wiping tangential contact of the roller by which the connectors are plated.

The connectors are plated by passing the connector contact point along a preferably helical trace on a rotary anode having a porous surface with the connector constituting the cathode. Ideally a plurality of connectors are passed along the roller by means of a bandolier, or other joining band. An apparatus for forming the connector contact point includes a pair of opposed endless belts in pressure driven relationship to each other, between which the bandolier containing the contact points is secured in opposed tangential relationship to the roller containing, upon its porous surface, a desired amount of electrolyte for plating.

It is a principal object of the present invention to provide a discreet contact point on an electronic connector.

A related object of the present invention is to furnish a plated connector contact point at only the point where the same will make electrical contact with a plated finger on a printed circuit board, and to control the plated dimensional portion of the contact as well as the thickness of the contact being plated.

A further object of the present invention is to provide a plated contact point on an electronic connector in which the plated area of contact is formed on the base connector totally be electrodeposition in intimate interface relationship between all electrodeposited metallic portions.

DESCRIPTION OF DRAWINGS

Further objects and advantages of the present invention will become apparent as the following description proceeds, taken in conjunction with the accompanying drawings in which:

FIG. 3 is a partially diagrammatic broken view of a rear portion of the unit taken in perspective and illustrating particularly the relationship between the opposed jaws, the plating roller and the adjustment of the plating roller.

FIG. 4 is a rear elevation of the mechanism shown in FIG. 3 in substantially the same scale.

DESCRIPTION OF THE PREFERRED EMBODIMENT

Prior to describing in detail the subject connector shown in FIGS. 10 through 14, it will be best understood in the light of how the same is made, and a typical apparatus for making the same.

Figure 9:
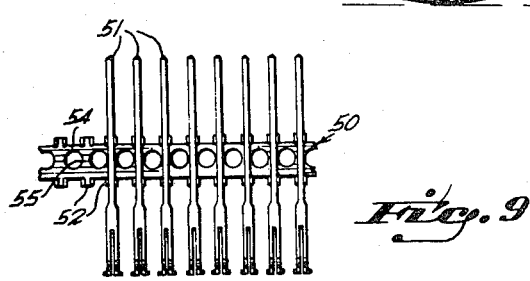
FIG. 9 is a plan view of a typical bandolier of a plurality of connector points.

The method for continuous contact plating of a curvilinear contact point presupposes connectors 51 in a bandolier 50 as shown in FIG. 9. The connector contact points 56 are positioned so that the bandolier is essentially perpendicular to the connector. Thereafter the contact points and bandolier 50 are oriented to pass the same along a longitudinal axis. A roller having an absorbent peripheral surface is positioned for driving rotatably with its long axis in parallel relationship to the bandolier, and its longitudinal axis. An electrolytic bath is provided for fluid contact with an absorbent surface on the roller. The bandolier 50 and its contained connector contact points 56 are then moved along the axis parallel to the axis of the roller with the contact points in tangential contact with the absorbent surface. The resultant action is to follow a helical path along the absorbent surface of the roller with the contact points energized as a cathode, and the electrolytic solution electrically energized, particularly as to the absorbent portion of the roller, as an anode. The method also contemplates means in pressure relationship to the absorbent surface of the roller to control the amount of plating solution that is passed thereabout for purposes of plating.

In the following description, a typical continuous plater utilizing the subject method and making the subject plated connectors is described. The continuous plater 10 is shown in rear elevation, and perspectively, in FIG. 1. There it will be seen that the continuous plater 10 includes a main frame 11, and a plurality of carrier belts 12. The carrier belts 12 include an upper belt 18 and lower belt 19, which are positioned to tangentially engage each other and pass through the jaws 14 which orient the same for tangential helical trace contract with an anode roller 15. A plating solution tray 16 is positioned beneath the anode roller 15, and provided with an electrolytic solution for purposes of plating, usually plating gold to the contact points. The entire continuous plater 10 presupposes a treatment to the contact points prior to entering the same, and thereafter. It is therefore a continuous plater 10, as a part of a total processing apparatus for contact points.

Figure 1:
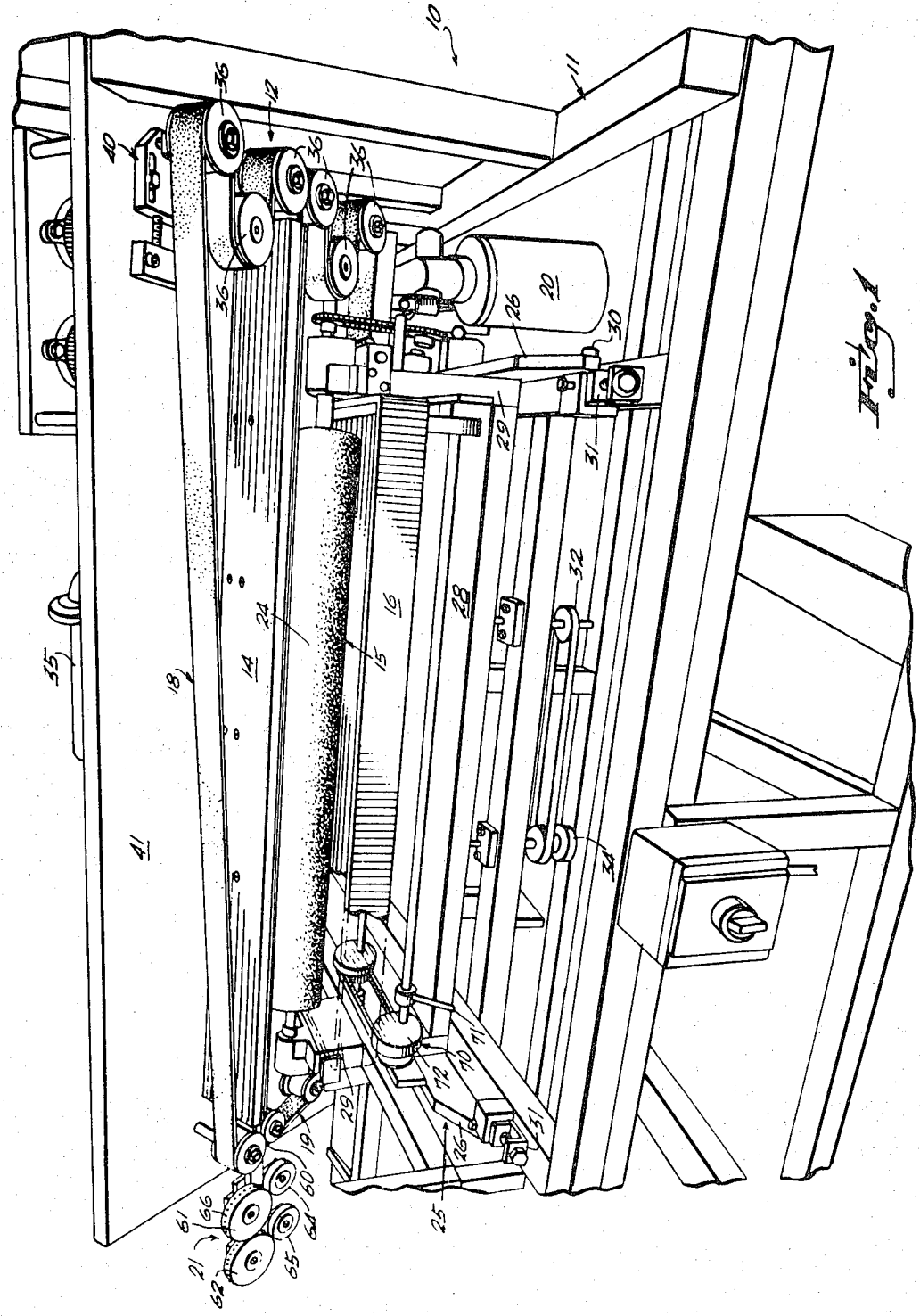
FIG. 1 is a perspective partially broken rear view of the continuous plater useful in forming the subject connector contact points.

To be noted in FIG. 1 is the drive motor 20 for the anode roller 15. A feed guide sprocket 21 is provided immediately adjacent the feed point 60, the same being the point where the upper belt 18 and the lower belt 19 first come into contiguous contact for the feeding of the contact points.

Figure 8:
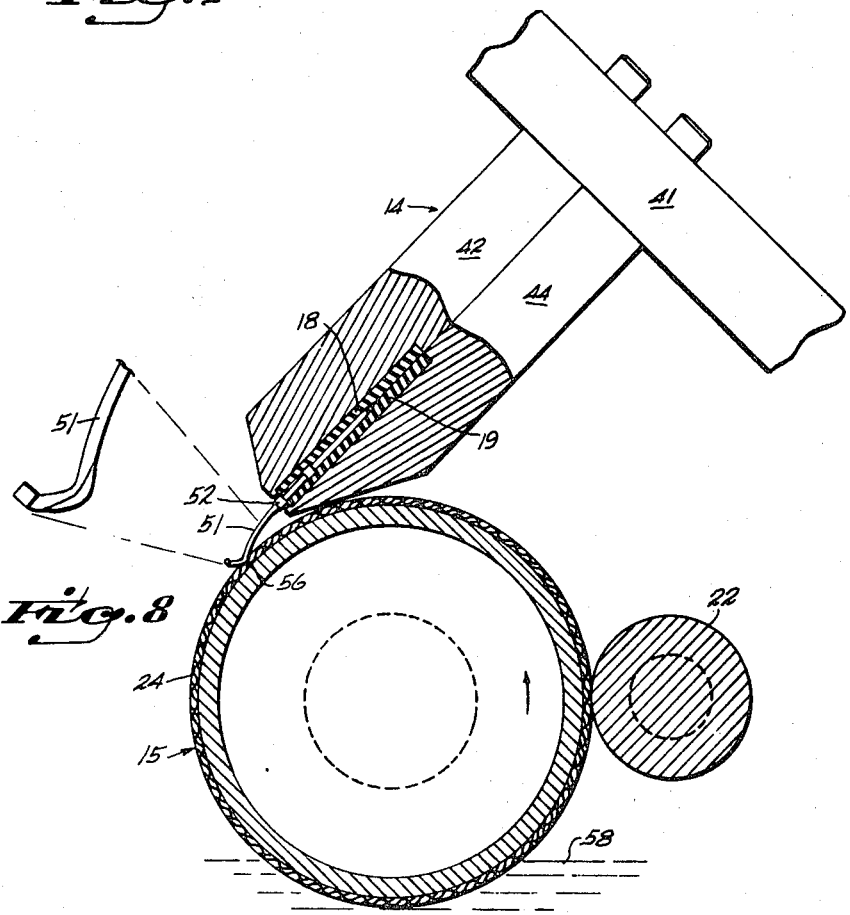
FIG. 8 is an enlarged, partially broken transverse sectiona view of the relationship between the jaws, driving belt and roller taken along section line 8—8 of FIG. 7.

Turning now to FIG. 8, it will be seen that the jaws 14 include an upper jaw 42, and a lower jaw 44. The same are secured to jaw bracket 41 which is permanently affixed to the frame 11 of the continuous plater 10. The bandolier 50 is grasped by the opposed upper belt 18 and lower belt 19, and so positioned that the contact point 56 is in contact relationship with the absorbent sleeve 24 of the roller 15. A meter roller 22 is provided for adjustable pressure contact against the porous sleeve 24, so that as the roller passes through the electrolyte 48, the amount of retained fluid after passing the metering roller 22 can be controlled by adjustment. The upper and lower belts 18, 19 may be of a closed cell foam like material, or solid rubber, depending upon the contacts being fed.

Figure 11:
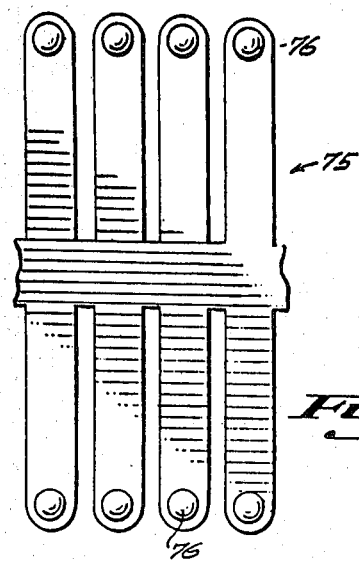
FIG. 11 is another view of alternative type connector in which the same are presented in an array on a band.
Figure 12:
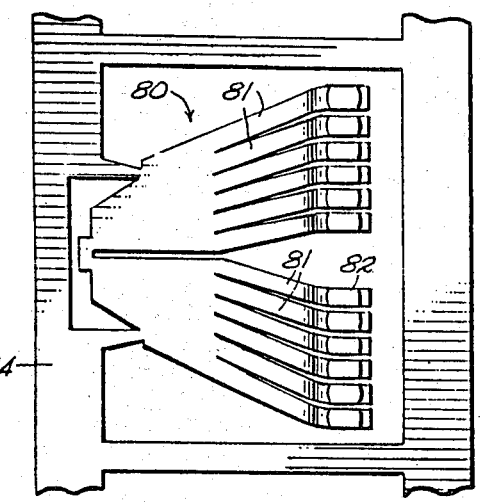
FIG. 12 is still another view of an alternative embodiment connector whereby the arrays are secured to a band as well.

The connectors 51, while generally secured to a bandolier, may take varying forms. As shown in FIG. 9, the bandolier 50 has a plurality of contacts 51 secured thereto by means of a fastener 52, in this instance opposed jaws. The band 54 is provided with a plurality of drive holes 55 which permit the same to be sprocket fed for movement. Alternative forms are shown in FIGS. 11 and 12 and will be described hereafter.

Turning now to FIG. 3, it will be seen that the roller 15 is secured to a roller frame 25 which includes a pair of roller frame legs 26, a roller frame base 28, and opposed roller frame posts 29 to which the roller 15 is mounted. The roller frame legs 26 are mounted at a pivot 30 to the main frame 11. A horizontal adjusting member 31 is provided at each end of the lower frame 25, immediately adjacent the pivot 30. Vertical adjustment means 32 are provided beneath the base 28 of the roller frame 25, and as noted in FIG. 4, by rotating the knob 34, the pads 59 bear upon the lower face of the base 28, and raise and lower the same. Here it will be appreciated that the adjustment takes a very modest arcuate path, but the same is of no major moment inasmuch as the adjustment of the roller 15 with regard to the position of the jaws 14 and the contained bandolier 50 is empirical.

Figure 5:
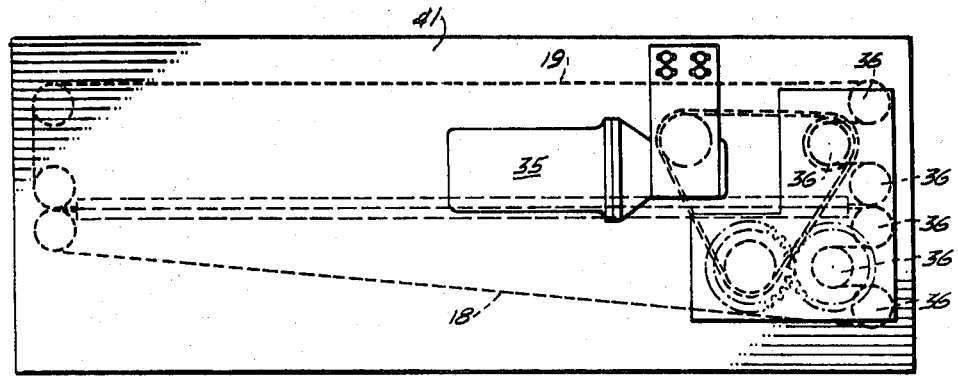
FIG. 5 is a partially diagrammatic view illustrating the drive mechanism for the carrier belts.

Turning now to FIG. 5 it will be seen that the upper and lower belts 18, 19 are driven by a belt motor 35 through a given sprocket mechanism to a plurality of belt pulleys 36. The upper belt and lower belt 18, 19 are reeved around the pulleys 36 to insure a firm flow and continuous drive. The motor vracket 38 permits some adjustment of the belt motor 35, and cooperates with the idler adjustment 40 (see FIG. 1) to adjustably secure the tension and frictional engagement of the belts 18, 19 with the pulleys 36.

Figure 6:
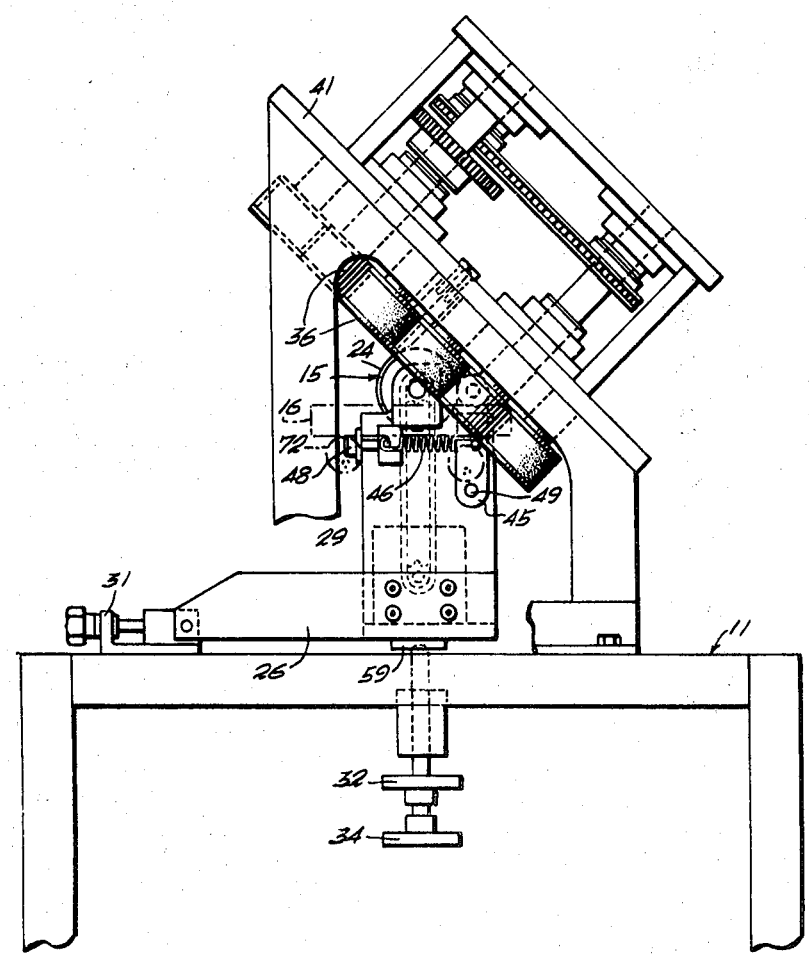
FIG. 6 is an end view of the mechanism shown in FIGS. 3 and 4 in slightly enlarged scale.
Figure 7:
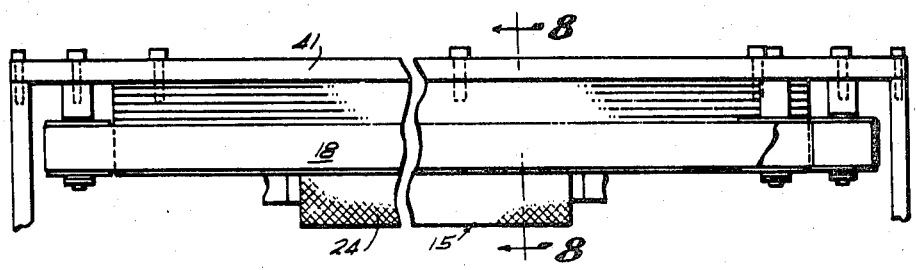
FIG. 7 is a top view of the jaws, driving belt, and anode roller broken at the midportion thereof.

In FIG. 6 the bracket 45 for the metering rollers disclosed, the same being urged by the spring 46 into compressive relationship with the roller 15. An adjustment nut 48 is provided to further adjust the yieldable relationship between the metering roll 22 and the anode roller 15, the bracket 45 being pivoted around pivot point 49.

Figure 2:
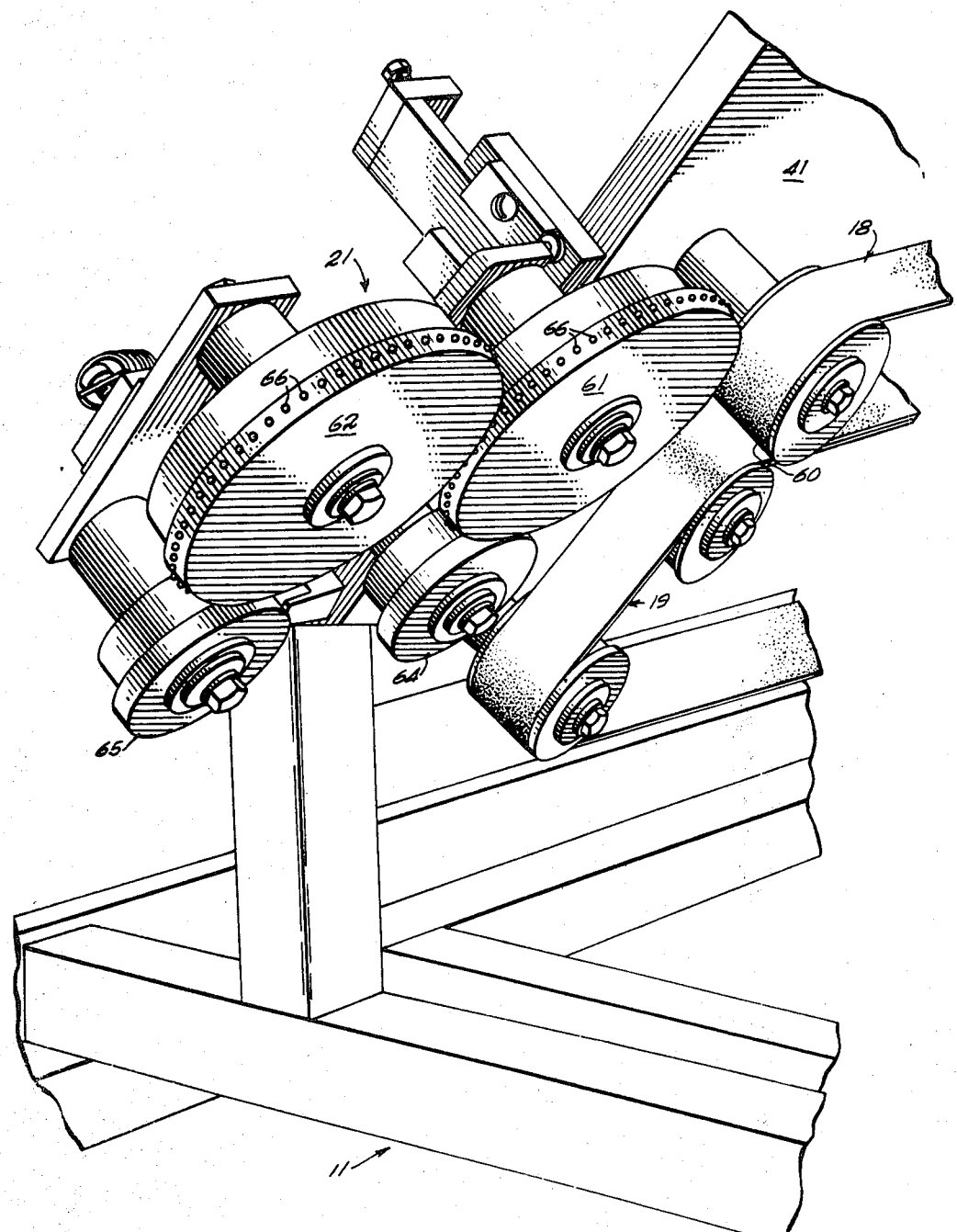
FIG. 2 is an enlarged partially broken view illustrating the feed guide for delivering a plurality of bandolier secured contact points to the opposed driving belts.

It is highly desirable to lead the bandolier 50 into the feed point 60 defined by the position where the upper belt 18 and lower belt 19 come together, the alignment to be as close as possible. It will be appreciated that to accomplish this purpose, a feed guide sprocket assembly 21 may be usefully employed (see FIG. 2). The assembly comprises an upper inner toothed wheel 61 and an upper outer toothed wheel 62. The teeth 66 are positioned circumferentially to penetrate the drive holes 55 of the bandolier 50. The driving effort of the upper and lower belts 18, 19, will . rotate the toothed wheel 61, 62, and pull the bandolier 50 between the teeth 66 and the lower inner guide wheel 64 and the outer lower guide wheel 65. Other alternatives are available for the feed guide 21, such as a pair of opposed plates. The principal result to be achieved is one of presenting the bandolier 50 in a path substantially coincident with the feed point 60, and the trace of the upper and lower belts 18, 19 as they pass through the opposed jaws 42, 44.

For purposes of cleaning, an eccentric tray mount assembly 70 (see FIG. 1) in which a single crank 71 may be rotated to the end that the four contact rollers 72 supporting the tray 16 lower their contact points, and the tray 16 may be removed from its fluid bath relationship with the roller 15 for cleaning, replenishing the electrolytic solution, or otherwise engaging in the maintenance and operation of the subject continuous plater 10.

Figure 10:
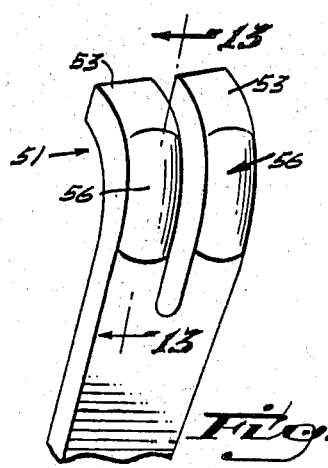
FIG. 10 is an enlarged perspective broken partially diagrammatic view of a connector illustrating the contact point and its curvilinear relationship to the connector fingers.

The typical connector contact 56 is shown in FIG. 10 on the connector 51 which, in this instance, has a pair of curvilinear fingers 53 to which the contact point 56 is secured by means of electrodeposition. The connector 51 is normally secured to a bandolier 50 as described hereinabove. An alterantive form of banded connectors 75 is shown in FIG. 11 where it will be seen that the individual connector fingers have a curvilinear circular spanked or punched out type contact 76. These contact points 76 can be formed in essentially the same equipment and utilizing essentially the same method as forming the connector contact point 56 as shown in FIG. 10. Still a further alternative embodiment of connectors is shown in FIG. 12 identifying the connector array 80 which has a plurality of fingers 81 having curvilinear contact point 82, the same all secured by means of the band 84.

Figure 13:
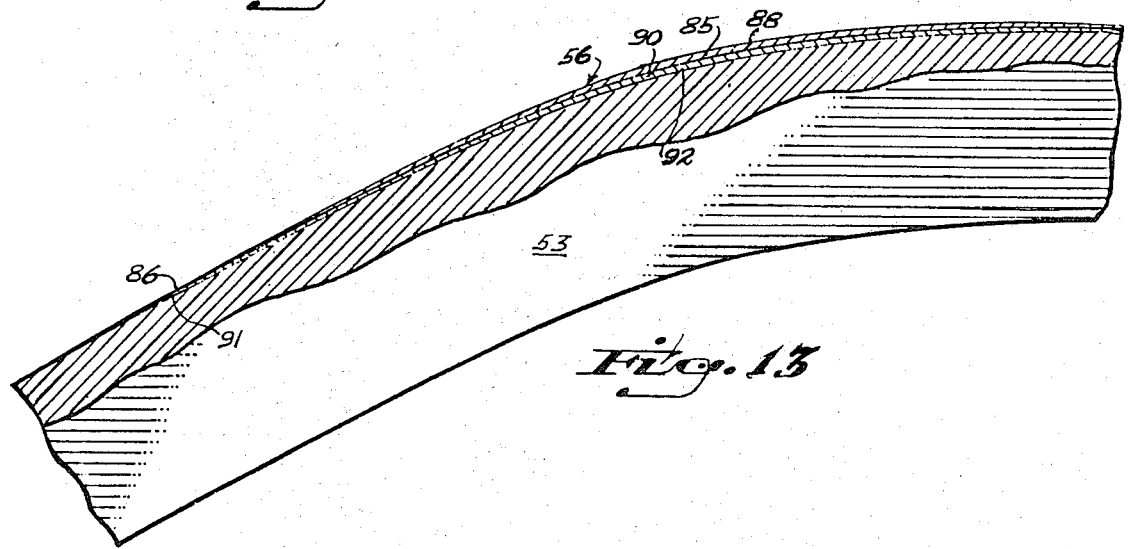
FIG. 13 is an enlarged photomicrograph to approximately 500× magnification of a cross-section taken through the contact shown in FIG. 10 along section line 13—13.

The detailed characteristics of the contact points 56, 76, 82 are shown in exemplary form in FIG. 13 which is a 500× photomicrograph of a cross-section taken essentially through section line 13—13 typically of the connector contact point 56 of FIG. 10. The same characteristics appear, however, with regard to other types of contact points such as those shown in FIG. 11, 76 and FIG. 12, 82.

In plating typical connectors with contact points 56, quite often a single layer, preferably gold is employed. The subject connectors are normally formed of a nonferrous spring temper alloy. Typical such alloys are phosphorous bronze, beryllium copper, and nickel silver. When the gold or other noble metal is plated on the contact point 56, it has a total interface of electrodeposition, the center section is raised, and it terminates in feather edges at both ends. When a bi-metallic plating is undertaken, such as will be described hereinafter, nickel is quite often employed as a diffusion barrier, and also to harden the total contact point. The nickel reduces the tendency of gold to diffuse into the copper of the connector, or copper to diffuse into the gold, either of which will offset the desirable connector contact point electrical properties.

Figure 14:
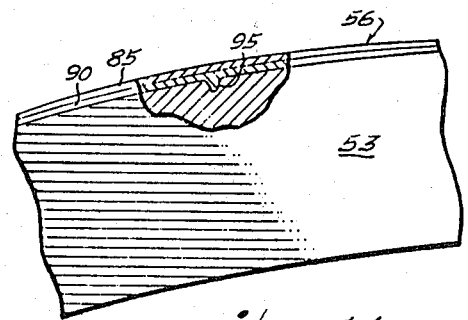
FIG. 14 is another photomicrograph illustrating a similar plated contact point showing how the same will accommodate defects such as pitting and the like occurring in the connector.

The key characteristic of the contact point 56 is shown in FIG. 13 is the outer plating preferably of gold 85 and the under plating preferably of nickel 90. In each instance the outer plated gold extends outwardly to a feather edge 86, and has a raised center 88. Similarly the underbody of nickel 90 extends out to two feather edges 91, and a raised center 92. Desirably the underplating metal, here exemplarly shown as nickel 90, and the outer electrically conductive metal, here shown exemplarly as gold 85, have common interfaces along the finger 53 and are the subject of electrodeposition throughout the length and substantially coterminous with the length of the plated portions. The contact point is free of any physical connection, weldments, or the like and, because the method of making the contact presupposes wiping engagement, it is essentially free of porosity, contamination, and other faults. Indeed, as shown in FIG. 14, this particular type contact point will effectively fill a pit 95 or other defect on the surface of the finger 53 to which the contact point 56 is applied.

By developing adequate quality control techniques, the plating system moves material in which the contact metal thickness is in the order of 0.002 inches. For high speed plating of both nickel and gold, the dwell time in the plating cells normally is less than five seconds. Deposition rates usually are 0.00002 inches per second. In present commercial operations, nickel and gold thicknesses up to 0.0005 inches are processed. Only the small plated areas of the connector are exposed to the plating solution, and its corrosive environment, meaning that the balance of the connector 51 is free from contamination which is a function of the plating activity. The connector 51 may be plated in excess of 40,000 contacts per hours, and with less than 10% overplate. In order to control thickness, beta ray backscatter instrumentation is employed which can compensate for base metal differences and minor density variations. An especially designed isotope platen and holder may be employed to measure small surfaces. Some connector parts require their own isotope platen holder designed to fit their particular shape. To further control the plating process, consistent deposit thickness is assured by measuring the ampere—seconds for each plating cell. Keeping the area being plated at the optimum current density for the part allows only the number of parts being plated per unit of time to effect the plating thickness. In addition, the speed of the strip through the plating line is monitored to control strip speed with the accuracy of one inch per minute.

Although particular embodiments of the invention have been shown and described in full here, there is no intention to thereby limit the invention to the details of such embodiments. On the contrary, the intention is to cover all modifications, alternatives, embodiments, usages and equivalents of a connector contact point as fall within the spirit and scope of the invention, specification and the appended claims.

What is claimed is:

1. A connector with a contact point for yieldably engaging a further contact in electrical communication comprising:
 a yieldable-metal underbody having an essentially uniform rectangular cross-section throughout a region and being longitudinally curvilinear in said region, and a conductive metal overlay plated onto the external surface of said region, said overlay
  (a) being located wholly or primarily on one of the external faces of said region,
  (b) terminating with a feather edge along the entire boundary of the overlay, such feather edge being distinct from the essentially abrupt edge resulting from fluid plating with masking or partial immersion of the plated object, and further being distinct from a plated area remote from the intended overlay location resulting from target plating with a shaped anode,
  (c) being approximately uniformly thick away from the feathered edges, thus exhibiting an absence of edge build-up and/or varying thickness characteristic of fluid plating regardless of anode shape, and
  (d) having a density characteristic of wiping electrodeposition.

2. The connector of claim 1, wherein the conductive metal is gold.

3. The connector of claim 1, wherein the overlay fills in any pits which may exist in the part of the surface of the region to which the overlay is plated, such fill ins containing significantly fewer and smaller bubbles than fill ins characteristic of immersion electrodeposition.

4. A connector with a contact point for yieldably engaging a further contact in electrical communication comprising:
  a yieldable-metal underbody having an essentially uniform rectangular cross-section throughout a region and being longitudinally curvilinear in said region,
  a diffusion barrier conductive metal first overlay plated onto the external surface of said region, said first overlay
    (a) being located essentially on one of the external faces of said region, but also extending up to and around the two side edges of said face and onto the adjacent faces a short distance,
    (b) terminating with a feather edge along the entire boundary of the first overlay, such feather edge being distinct from the essentially abrupt edge resulting from fluid plating with masking or partial immersion of the plated object, and further being distinct from an extensive, minimal-thickness, plated area remote from the intended first overlay location resulting from target plating with a shaped anode,
    (c) being approximately uniformly thick away from the feathered edges, including around said side edges and onto said adjacent faces, thus exhibiting an absence of edge build-up and/or varying thickness characteristic of fluid plating regardless of anode shape, and
    (d) having a density characteristic of wiping electrodepositon, and
  a conductive metal second overlay plated onto the external surface of the first overlay, said second overlay
    (a) being located essentially coterminously with the first overlay, including extending up to and around the two plated edges of the face containing the major portion of the first overlay and onto the adjacent plated faces a short distance,
    (b) terminating with a feather edge along the entire boundary of the second overlay, such feather edge being distinct from the essentially abrupt edge resulting from fluid plating with masking or partial immersion of the plated object, and further being distinct from an extensive, minimal-thickness, plated area remote from the intended second overlay location resulting from target plating with a shaped anode,
    (c) being approximately uniformly thick away from the feathered edges, including around said side edges and onto said adjacent faces, thus exhibiting an absence of edge build-up and/or varying thickness characteristic of fluid plating regardless of anode shape, and
    (d) having a density characteristic of wiping electrodeposition.

5. The connector of claim 4, wherein the first overlay is nickel.

6. The connector of claim 4, wherein the second overlay is gold.

7. The connector of claim 4, wherein the first overlay fills in any pits which may exist in the part of the surface of the region to which the overlay is plated, such fill ins containing significantly fewer and smaller bubbles than fill ins characteristic of immersion electrodeposition.

8. A connector with a contact point for yieldably engaging a further contact in electrical communication comprising:
  a yieldable-metal underbody having a surface portion approximating a spherical cap, and
  a conductive metal overlay plated onto said surface portions, said overlay
    (a) being located wholly on said surface portion,
    (b) terminating with a feather edge along the entire boundary of the overlay, such feather edge being distinct from the essentially abrupt edge resulting from fluid plating with masking or partial immersion of the plated object, and further being distinct from a plated area remote from the intended overlay location resulting from target plating with a shaped anode,
    (c) being approximately uniformly thick away from the feathered edges, thus exhibiting an absence of edge build-up and/or varying thickness characteristic of fluid plating regardless of anode shape, and
    (d) having a density characteristic of wiping electrodeposition.

9. The connector of claim 8 wherein the overlay is gold.

10. The connector of claim 8, wherein the overlay fills in any pits which may exist in the part of the surface of the region to which the overlay is plated, such fill ins containing significantly fewer and smaller bubbles than fill ins characteristic of immersion electrodeposition.

11. An electrical contact having an essentially rectangular cross-section at the point of contact comprising in combination,
  a yieldable metal underbody having a curvilinear contact point for yieldably engaging a member in electrical communication,
  a conductive metal overlay plated to said underbody having a thickened center section and feather edge end portions presenting a curvilinear surface of electrodeposited conductive metal for direct yieldable electrical engagement with a further contact point,
  said conductive metal overlay being characterized by uniform deposit thickness at the critical contact area and the absence of edge build-up and back plating without evidence of masking of the type resulting from fluid plating in the absence of a wiping type of electrodeposition, whereby the contact surface has a minimized central curvilinear thickness of metal and in which the interface is formed by electrodeposition.

12. The contact of claim 11, wherein
an underbody of diffusion barrier electrically conductive metal is plated to a curvilinear portion of said contact point characterized by feather edges at both ends, and a thicker section at a midpoint of the underbody.

13. The contact point of claim 11 above, wherein the conductive metal is gold.

14. The contact point of claim 12, wherein the underbody plating is nickel.

15. The contact of claim 13, wherein the underbody coat of metal is nickel.

* * * * *